(12) United States Patent   (10) Patent No.: US 12,625,215 B2
Rehwald et al.   (45) Date of Patent: May 12, 2026

(54) COMPRESSED SENSING USING DIFFERENT K-SPACE SAMPLING PATTERNS

(71) Applicant: Siemens Healthineers AG, Forchheim (DE)

(72) Inventors: Wolfgang Rehwald, Chapel Hill, NC (US); Jianing Pang, Issaquah, WA (US)

(73) Assignee: Siemens Healthineers AG, Forchheim (DE)

( * ) Notice: Subject to any disclaimer, the term of this patent is extended or adjusted under 35 U.S.C. 154(b) by 181 days.

(21) Appl. No.: 18/741,917

(22) Filed: Jun. 13, 2024

(65) Prior Publication Data

US 2025/0180684 A1    Jun. 5, 2025

Related U.S. Application Data

(60) Provisional application No. 63/605,676, filed on Dec. 4, 2023.

(51) Int. Cl.
| | |
|---|---|
| *G01R 33/56* | (2006.01) |
| *G01R 33/54* | (2006.01) |
| *G01R 33/565* | (2006.01) |

(52) U.S. Cl.
CPC ....... *G01R 33/5608* (2013.01); *G01R 33/543* (2013.01); *G01R 33/5602* (2013.01); *G01R 33/56509* (2013.01)

(58) Field of Classification Search
CPC .............. G01R 33/543; G01R 33/5602; G01R 33/5608; G01R 33/56509
See application file for complete search history.

(56) References Cited

U.S. PATENT DOCUMENTS

| | | | | |
|---|---|---|---|---|
| 10,753,994 | B2 * | 8/2020 | Salerno | G01R 33/4835 |
| 11,204,409 | B2 * | 12/2021 | Wang | G01R 33/5611 |
| 11,313,934 | B2 * | 4/2022 | Zeller | G01R 33/5611 |
| 11,393,136 | B2 * | 7/2022 | Nagashima | A61B 5/055 |
| 11,547,317 | B2 | 1/2023 | Rehwald | |
| 2023/0132314 | A1 | 4/2023 | Rehwald et al. | |
| 2023/0288509 | A1 | 9/2023 | Rehwald et al. | |

OTHER PUBLICATIONS

Baron, Dror et al., "An Information-Theoretic Approach to Distributed Compressed Sensing", 43rd Allerton Conference on Communication, Control, and Computing, Sep. 2025, 13pgs.
Geethanath, Sairam et al., "Compressed Sensing MRI: A Review", Critical Reviews™ in Biomedical Engineering, 41(3), (2013), (pp. 183-204, 22 total pages).
Lustig, Michael et al., "Compressed Sensing MRI", IEEE Signal Processing Magazine [72] Mar. 2008, 11pgs.

(Continued)

*Primary Examiner* — Gregory H Curran

(57) ABSTRACT

A system and method comprises acquisition of a plurality of k-space sets, each of the plurality of k-space sets comprising a different incoherent variable-density under-sampled combination of k-space data points, performance of iterative reconstruction on the plurality of k-space sets to generate a plurality of images, where each of the plurality of images is associated with a different one of the plurality of k-space sets, and averaging of the generated plurality of images to generate an image.

20 Claims, 7 Drawing Sheets

(56)                    References Cited

OTHER PUBLICATIONS

Khan, Mohammad Emtiyaz, "Compressed Sensing, Compressed Classification and Joint Signal Recovery", https://emtiyaz.github.io/Writings/EMTmachinelearning.pdf, 6pgs.

Wakin, Michael B. et al., "Recovery of Jointly Sparse Signals from Few Random Projections", Proc. Neural Information Processing Systems (NIPS), Dec. 2005., 8pgs.

Siemens MRI Compressed Sensing Supplement, The Magazine of MRI, Magnetom Flash (66) Mar. 2016 | www.siemens.com/magnetom-world, (pp. 1-60, 60 total pages).

Kellman, P., et al., "Motion-corrected free-breathing delayed enhancement imaging of myocardial infarction", Magn Reson Med, 2005. 53(1), DOI: 10.1002/mrm.20333, p. 194-200.

Kim, Raymond J., et al., "Relationship of MRI Delayed Contrast Enhancement to Irreversible Injury, Infarct Age, and Contractile Function", Nov. 9, 1999;100(19), doi: 10.1161/01.cir.100.19.1992, download from http://ahajournals.org, [retrieved on Jun. 11, 2024], (pp. 1992-2002, 11 total pages).

Simonetti, O.P. et al., "An Improved MR Imaging Technique for the Visualization of Myocardial Infarction", Radiology, 2021, 218(1), https://doi.org/10.1148/radiology.218.1.r01ja50215, (pp. 215-223, 9 total pages).

Rich, Adam et al., CArtesian sampling with Variable density and Adjustable temporal resolution (CAVA), Magnetic Resonance in Medicine, 2020. 83(6): doi: 10.1002/mrm.28059, (p. 2015-2025, 22 total pages).

* cited by examiner

COMPRESSED SENSING USING DIFFERENT K-SPACE SAMPLING PATTERNS

CROSS-REFERENCE TO RELATED APPLICATIONS

This application claims priority to U.S. Provisional Patent Application No. 63/605,676, filed Dec. 4, 2023, the disclosure of which is incorporated herein by reference for all purposes.

BACKGROUND

A Magnetic Resonance (MR) scanner generates images of patient anatomy using timed sequences of radio-frequency (RF) pulses. MR imaging is useful in scenarios requiring high contrast between different soft tissues.

MR imaging consists of the acquiring k-space data and calculating an image from the k-space data using a two-dimensional Fast Fourier Transform (FFT). Different regions of k-space represent different image properties. For example, the center region of k-space contains image brightness and contrast information, and the edges of k-space contain image sharpness and detail information. A low-resolution image may therefore be calculated using only k-space data from the center region of k-space. A high-resolution image typically requires k-space data from all of k-space.

In segmented MR imaging, an image is reconstructed from k-space data acquired in multiple shots. Each shot acquires a different portion of k-space, for example m lines of an n-line k-space. Typically, each shot is taken with precise temporal resolution (i.e., in the same cardiac phase but in a different heartbeat). Acquisition of all k-space lines therefore occurs over n heartbeats.

According to a Late Gadolinium Enhancement (LGE) sequence, a T1-shortening Gadolinium-based contrast agent is injected into a patient, and an inversion recovery (IR)-prepared sequence is performed. When used for cardiac imaging, for example, the LGE sequence produces T1-weighted images in which viable (i.e., healthy, living) myocardium appears dark and infarcted (i.e., dead) myocardium appears bright. The amount of data needed to create an LGE image with high spatial and temporal resolution is too large to be acquired in a single shot. Therefore, the data is acquired in segments over multiple heartbeats while the patient holds their breath.

Such breath-held, high-spatial resolution segmented LGE images are susceptible to ghosting artifacts. Ghosting artifacts are fake, periodic replications of moving structures, for example the myocardial wall and the interface between chest fat and surrounding air. Ghosting artifacts can be caused by small motions resulting from imperfect breath holding, arrhythmia, or poor ECG-triggering.

Ghosting artifacts are naturally absent from single-shot images since artificial frequencies cannot be created without segmentation. However, even at similar spatial resolutions, a single-shot image exhibits a lower signal-to-noise ratio (SNR), poorer temporal resolution, and reduced T1-contrast as compared to an image resulting from a segmented acquisition.

Systems are desired to efficiently generate high-quality images using single-shot k-space data acquisition.

DETAILED DESCRIPTION

The following description is provided to enable any person in the art to make and use the described embodiments. Various modifications will remain apparent to those in the art.

Embodiments provide a Compressed Sensing (CS) single-shot method where each of multiple single shots is acquired with a different k-space sampling pattern. Images reconstructed from each single shot therefore exhibit artifacts which are unique to each image. The images may then be combined (e.g., averaged) to generate an image exhibiting substantially reduced, or no, artifacts. Embodiments may therefore provide improved image quality in the presence of motion and flow over segmented IR-prepared sequences.

Moreover, the acquisition of multiple single shots of the same region of interest enables joint CS reconstruction of the images. Joint CS reconstruction exploits inter-image sparsity in addition to intra-image sparsity, therefore may produce higher-quality images than CS reconstruction which relies only on intra-image sparsity.

Figure 1:
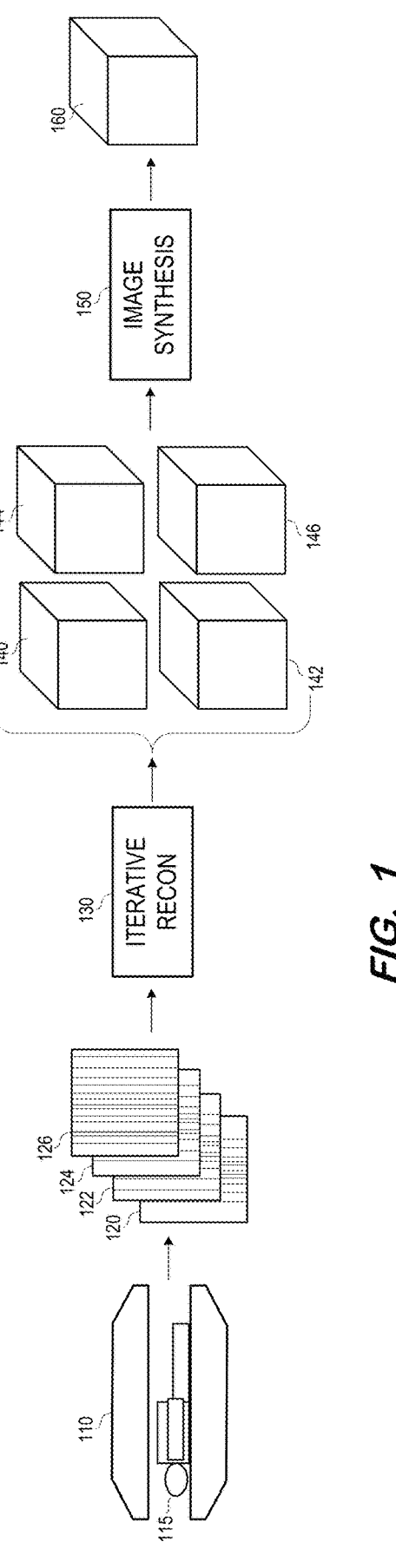
FIG. 1 illustrates acquisition of multiple different incoherent distributions of k-space data and generation of an image therefrom according to some embodiments.

FIG. 1 illustrates acquisition of multiple different incoherent distributions of k-space data and generation of an image therefrom according to some embodiments. The illustrated components of FIG. 1 may be implemented using any combinations of hardware and/or software that are or become known. One or more components may be implemented using the same combination of hardware and/or software (e.g., a desktop computer, a physical server, a virtual server). The processes illustrated in FIG. 1 may be executed temporally and/or physically distant from one another.

MR scanner 110 is used to acquire k-space data representing patient 115. As is known in the art, acquisition of the k-space data may be preceded by injecting a contrast agent into patient 115. K-space data is acquired by executing one or more pulse sequences as is known in the art. The pulse sequences may be designed to acquire particular lines of k-space.

According to Cartesian k-space sampling, the two directions in k-space are the phase encoding (PE) direction and the frequency encoding (FE) direction. K-space lines are disposed on an evenly-spaced grid in which all neighboring lines are the same distance from one another in the PE direction. A sampling "distribution" describes the subset of PE lines in k-space that are acquired by a given pulse sequence. Each readout within a pulse sequence acquires one PE line of raw data and multiple readouts may be performed in one shot. Accordingly, each shot may acquire a desired subset of PE lines.

To accelerate acquisition, some techniques such as GRAPPA or SENSE acquire every n-th (e.g., every other) PE line and calculate the non-acquired lines based on the acquired lines and the coil sensitivities of multiple receiver coil elements. The lines acquired by these techniques are distributed according to a regular, periodic pattern. In CS, each shot acquires an incoherent (e.g., pseudo-random), variable-density distribution of PE lines. Since most of the k-space energy is near the center, the distribution usually samples the central PE lines of k-space more densely than the periphery.

FIG. 1 illustrates the acquisition of k-space sets 120, 122, 124 and 126. Each of sets 120, 122, 124 and 126 consists of a distribution of a plurality of k-space lines acquired in a single shot. Each distribution is CS-compatible (i.e., pseudo-random, variable-density and undersampled) as is known in the art. Moreover, each distribution differs from each other distribution.

Iterative construction component 130 generates images 140, 142, 144 and 146 based on sets 120, 122, 124 and 126. Iterative construction component 130 may perform CS reconstruction to maximize data consistency and transform sparsity as is known in the art. Each of images 140, 142, 144 and 146 may be reconstructed based on a single one of sets 120, 122, 124 and 126. Advantageously, each of images 140, 142, 144 and 146 may be jointly reconstructed based on data of one of sets 120 and temporal sparsity calculated based on all of sets 120, 122, 124 and 126. In the latter case, temporal sparsity may be achieved by designing a pulse sequence such that each of k-space sets 120, 122, 124 and 126 is acquired from the same region of interest during the same phase of motion.

Image synthesis component 150 generates composite image 160 based on images 140, 142, 144 and 146. Composite image 160 depicts the same structures as images 140, 142, 144 and 146 reduces the appearance of artifacts which might be present in images 140, 142, 144 and 146. In some embodiments, composite image 160 is an average of all of images 140, 142, 144 and 146. In other words, the real and imaginary values of each complex pixel of image 160 are averages of the real and imaginary values of the same pixel in images 140, 142, 144 and 146. In another example, the real and imaginary values of each complex pixel of image 160 are equal to the sum of the real and imaginary values of the same pixel in images 140, 142, 144 and 146. Since each of images 140, 142, 144 and 146 includes its own unique CS-related artifacts, such averaging or summation reduces the appearance of these artifacts within composite image 150.

Figure 2:
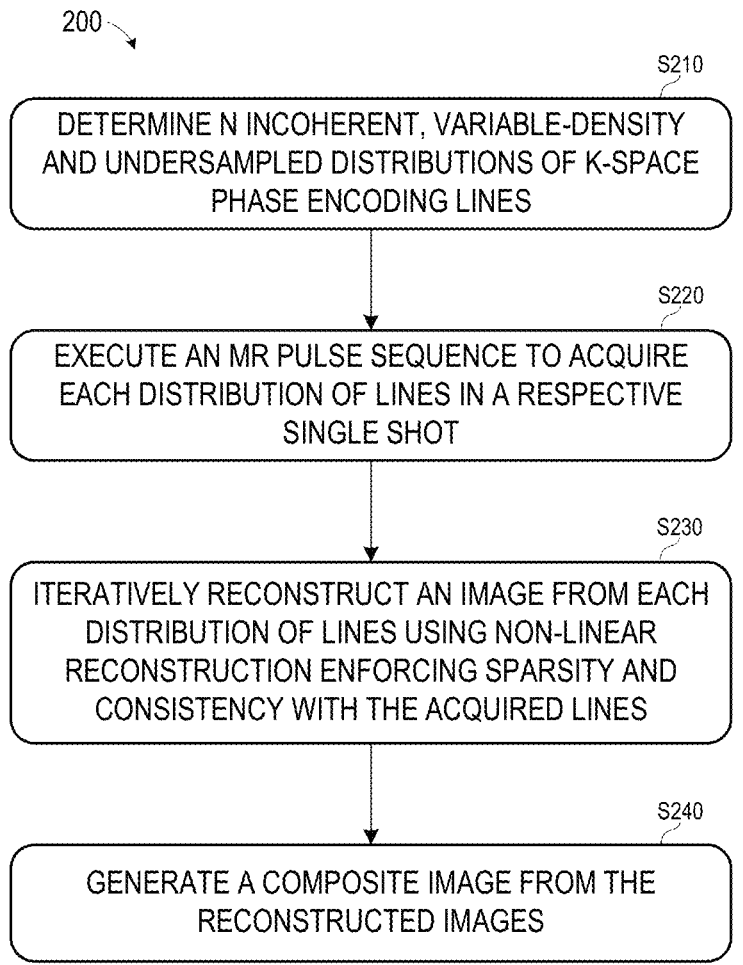
FIG. 2 is a flow diagram of a process to generate an image from multiple different incoherent distributions of k-space data according to some embodiments.

FIG. 2 comprises a flow diagram of process 200 to generate an image from multiple different incoherent distributions of k-space data according to some embodiments. In some embodiments, various hardware elements of an MR scanner execute program code to perform process 200. The steps of process 200 need not be performed by a single device or system.

Process 200 and all other processes mentioned herein may be embodied in executable program code read from one or more of non-transitory computer-readable media, such as a disk-based or solid-state hard drive, a DVD-ROM, a Flash drive, and a magnetic tape, and then stored in a compressed, uncompiled and/or encrypted format. Such program code may be executed by one or more processing units (e.g., a processor, a processor core, a processor thread) of a computing system to cause the computing system to execute process 200 and/or all other processes mentioned herein. In some embodiments, hard-wired circuitry may be used in place of, or in combination with, program code for implementation of processes according to some embodiments. Embodiments are therefore not limited to any specific combination of hardware and software.

Initially, at S210, a number (e.g., N) of incoherent, variable-density and undersampled distributions of k-space PE lines are determined. Some of the distributions may include one or more identical k-space PE lines, while some distributions may include completely different k-space PE lines. In some embodiments, each distribution may be different from each other distribution (i.e., no distribution includes the same PE lines as another distribution). A distribution may be determined at S210 using any variable-density pseudo-random sampling scheme that is or becomes known.

Figure 3:
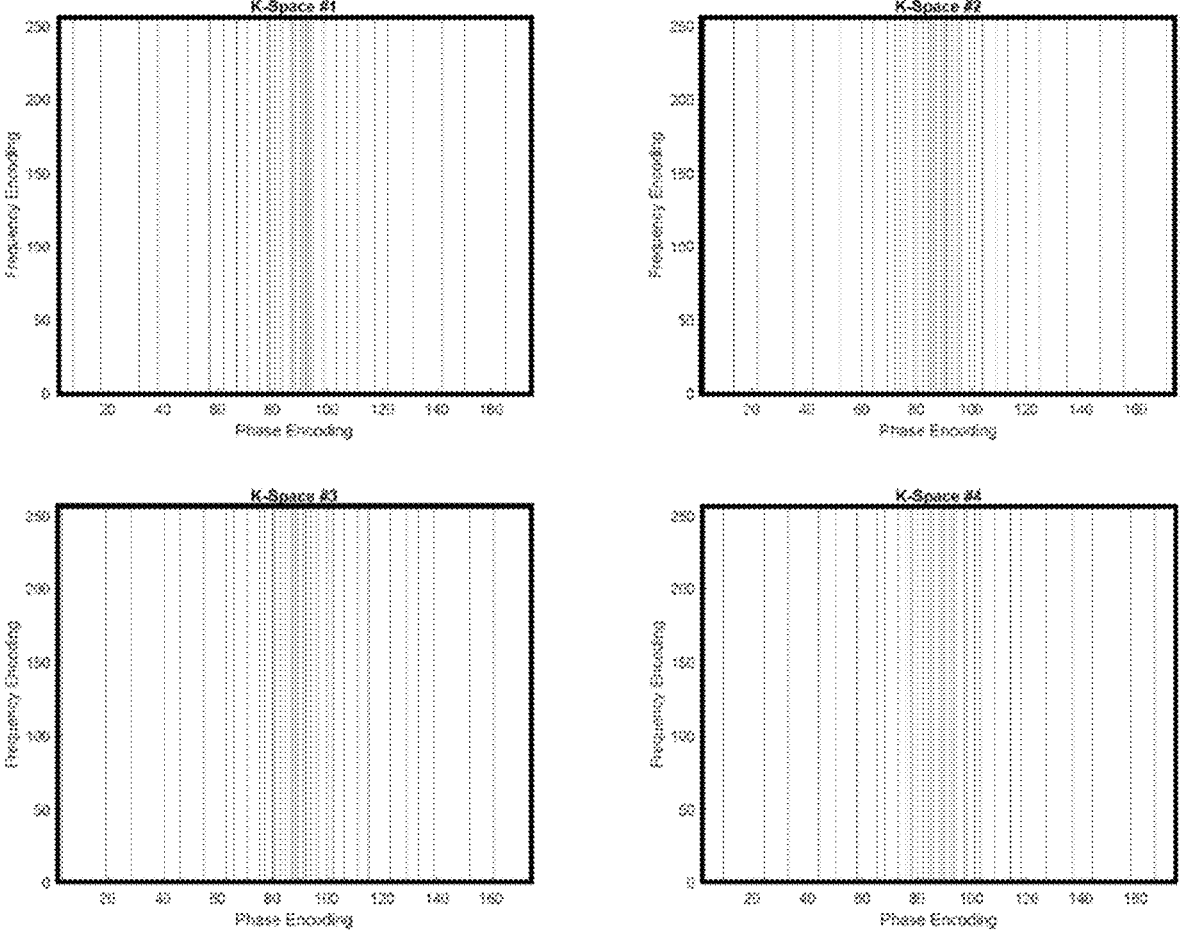
FIG. 3 illustrates different incoherent distributions of k-space data acquired in respective single shots according to some embodiments.

FIG. 3 illustrates four distributions of k-space PE lines according to some embodiments of S210. As shown, each distribution is different from the others, incoherent, variable-density and undersampled. Each distribution is denser at the center of k-space than at the edges, due to the concentration of k-space energy and imaging information of interest at the center. According to the example, each distribution is five-fold undersampled, including 35 of the 175 PE lines of k-space.

According to some embodiments, S210 proceeds by initially calculating the number M of PE lines to be acquired as M=N/R, where N is the number of PE lines in k-space and R is the desired under-sampling rate. M floating point numbers are then generated by the following formula:

$$K_i = \mathrm{mod}(i * G * N, N)$$

where i=1, 2, . . . , M, and G=($\sqrt{5}$−1)/2~=0.618, i.e., the golden ratio.

A scaling function D(K) is defined, which takes the PE coordinate of a PE line as input and produces a value between a positive minimum value and one. D(K) is defined such that the closer an input PE coordinate is to the center PE line, the closer D(K) is to the positive minimum value and the closer the PE coordinate is to an edge of k-space, the closer D(K) is to 1.

A new set of M floating point numbers is then generated by the following formula:

$$K_i' = K_i * D(K_i)$$

where i=1, 2, . . . , M, and a positive minimum value of D(K) is assigned such that:

$$\left| K_i' - K_j' \right| \geq 1$$

for all i, j=1, 2, . . . , M, and i≠j.

Next, a set S of M acquired PE lines on the Cartesian grid is determined by:

$$S_i = \mathrm{round}(K_i')$$

where i=1, 2, . . . , M. The set S represents one incoherent, variable-density and undersampled distribution of k-space PE lines.

Figure 4:
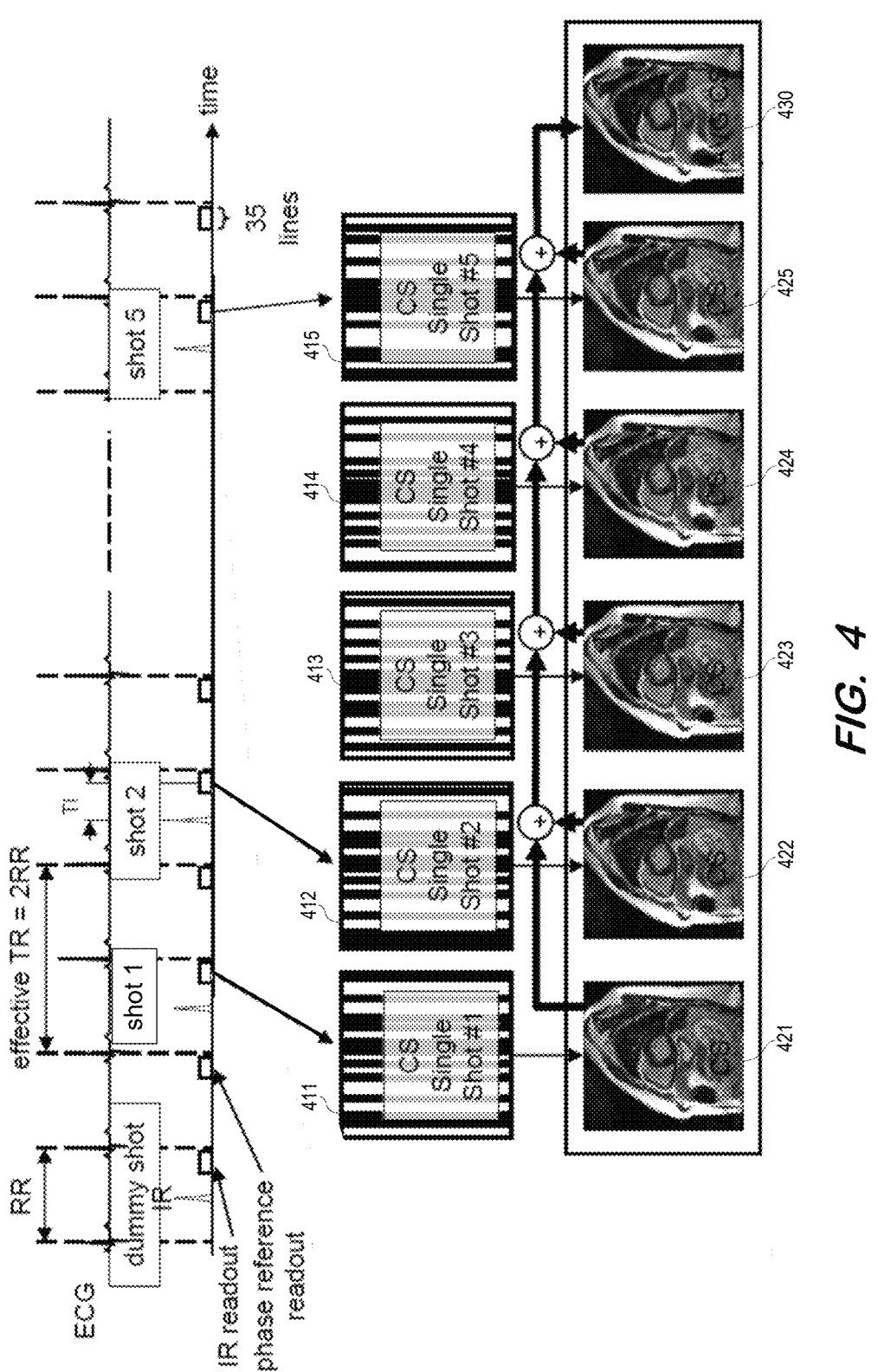
FIG. 4 illustrates a pulse sequence to acquire different incoherent distributions of k-space data in respective single shots according to some embodiments.

At S220, an MR pulse sequence is executed to acquire each distribution of lines in a respective single shot. FIG. 4 illustrates a pulse sequence to acquire different incoherent distributions of k-space data in respective single shots according to some embodiments. The FIG. 4 pulse sequence is a phase-sensitive inversion-recovery (PSIR) pulse sequence in which each of five IR-prepared readouts is followed by acquisition of a corresponding non-IR-prepared phase reference readout. Embodiments are not limited to PSIR or IR pulse sequences. The pulse sequence is triggered based on the patient's ECG signal such that all k-space sets (i.e., IR and phase reference) are acquired during the diastolic phase of the RR-interval.

According to some embodiments, each IR-prepared readout uses a different inversion time. Some embodiments acquire the phase reference k-space sets following a combined magnetization transfer and inversion preparation as in the Flow Independent Dark Blood DeLayed Enhancement (FIDDLE) sequence.

Each IR readout acquires a different one of the distributions determined at S210, and its following reference readout acquires the same distribution. Each of distributions 411-415 is a set of M (M=35 in this example) 35 PE lines distributed throughout k-space. According to some embodiments, each of distributions 411-415 is acquired from a same image slice such that the distributions are similar in image space.

At S230, an image is iteratively reconstructed from each distribution of lines. The reconstruction enforces sparsity and consistency with the acquired lines. FIG. 4 illustrates reconstruction of images 421-425 from a respective one of distributions 411-415. For example, image 421 is iteratively reconstructed so as to enforce consistency with distribution 411 and sparsity within a given transform domain.

Figure 5A:
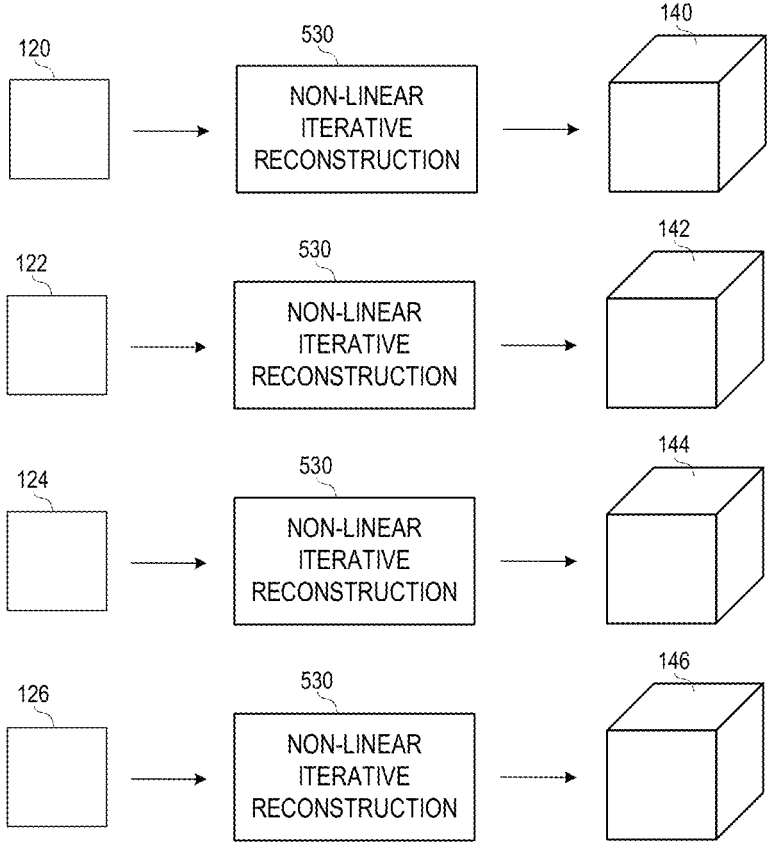
FIG. 5a illustrates generation of images from different incoherent distributions of k-space data according to some embodiments.

FIG. 5a illustrates generation of images from different incoherent distributions of k-space data according to some embodiments of S230. In the illustrated example, the same non-linear iterative reconstruction algorithm 530 is applied to each of distributions 120, 122, 124, 126 to generate respective images 140, 142, 144, 146. Each image 140, 142, 144, 146 is iteratively reconstructed so as to enforce consistency with its respective distribution 120, 122, 124, 126 and sparsity of its respective distribution 120, 122, 124, 126 within a given transform domain (e.g., the spatial dimension). In this regard, reconstruction of each image 140, 142, 144, 146 occurs independently of the reconstruction of each other image.

Figure 5B:
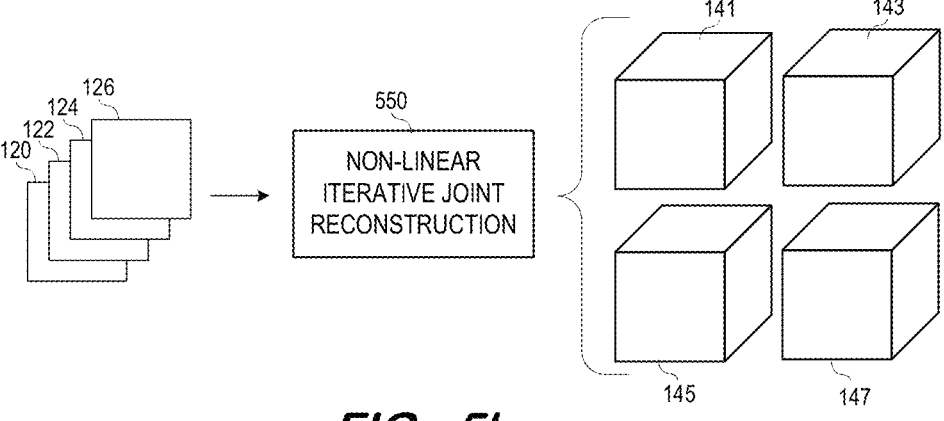
FIG. 5b illustrates generation of images from different incoherent distributions of k-space data using joint reconstruction according to some embodiments.

FIG. 5b illustrates generation of images from different incoherent distributions of k-space data using joint reconstruction according to some embodiments. Non-linear iterative joint reconstruction algorithm 530 is applied to distributions 120, 122, 124, 126 to generate respective images 141, 143, 145, 147. Each image 141, 143, 145, 147 is iteratively reconstructed so as to enforce consistency with its respective distribution 120, 122, 124, 126 and joint sparsity of distributions 120, 122, 124, 126 within a given transform domain (e.g., the temporal dimension).

Since the distributions are acquired at substantially the same phase of motion and of substantially the same image slice, differences between images 141, 143, 145, 147 are expected to be small. This redundancy of information along the temporal dimension often represents a greater sparsity than the sparsity of each individual distribution in the spatial dimension. The greater sparsity may reduce computation complexity and increase resulting image quality. Acquiring multiple single-shot images thereby efficiently enables an advantageous joint CS reconstruction in some embodiments.

A brief description of CS reconstruction now follows. Generally, CS reconstruction iterates between image space and a transform space W to determine an image x which minimizes $$\|Ax - y\|_2^2 + \lambda\|Wx\|_1,$$

in which y denotes the acquired incoherent, variable-density distribution of PE lines and A is the system matrix describing the data acquisition process (i.e., the transform from spatio-temporal to frequency domain). A consists of the coil sensitivity maps of individual receiver coil elements, the Fourier transform, and the distribution of acquired lines. The term $$\|Ax - y\|_2^2$$

represents the 'data consistency' and is the least-squares difference (i.e., the L2 norm, $$\|\cdot\|_2^2)$$

between the estimated image x and the acquired k-space data y. The term $\lambda\|Wx\|_1$ describes the 'transform sparsity' and is the sum of the absolute values of the pixels in the transform space (i.e., the L1 norm $\|\cdot\|_1$). $\lambda$ is an empirical weighting factor for balancing data consistency vs. transform sparsity.

Initially, y is Fourier transformed into an image. This image suffers from strong sub-sampling aliasing artifacts which appear 'noise like' due to the incoherence of the sub-sampling. As will be described below, these artifacts may be effectively suppressed by the denoising effects of CS reconstruction.

The image is transformed into a sparse representation in W-space. The image 'informational content' is concentrated within a relatively small region in W-space, while most pixels exhibit low values. This characteristic allows denoising via a thresholding procedure. For example, all pixels with a value<threshold are set to zero, and the threshold is subtracted from all other pixel values. The resulting representation includes fewer non-zero pixels (coefficients) and the sparsity of the image in W-space is increased.

The W-space representation is transformed back into image space with the inverse transformation $W^{-1}$. The image exhibits less noise than the initial image. This corresponds to a suppression of the noise-like aliasing artifacts due to the incoherent sampling.

An inverse Fast Fourier transformation FFT-1 is applied to the denoised image to convert the image to k-space. This k-space is a complete k-space so, in order to compare this k-space to y, the k-space is masked to set PE lines which do not exist in y to 0. A difference k-space is determined by subtracting the masked k-space from the measured k-space y. The difference k-space corresponds to the error (i.e., data inconsistency) created by the above-described thresholding step.

A Fourier transformation converts the difference k-space into a difference image and the difference image is added to the initially-created image. This updated image exhibits less noise-like artifacts (i.e., corresponding to a higher sparsity in W-space) than the initially-created image. The updated image is converted to W-space as described above and the process iterate. Each iteration increases the sparsity (in W-space), which corresponds to reducing the aliasing artifacts in image space. Simultaneously, consistency of the reconstructed image with measured k-space y is maintained. The final image is consistent with measured data measured k-space y and is substantially free of noise-like aliasing artifacts due to the maximization of the transform sparsity.

Although CS reconstruction serves to minimize noise-like aliasing artifacts resulting from incoherent undersampling, the resulting reconstructed image may still include these or other artifacts due to factors which including but are not limited to patient motion, inadequate sparsity, etc. However, acquiring multiple single-shot images of different k-space distributions according to some embodiments advantageously creates different CS-related artifacts in each image that can be substantially removed by averaging, adding, or otherwise combining the images.

In the case of PSIR imaging, the acquired phase-reference k-space sets may also be independently or jointly CS-reconstructed into individual complex-valued reference images. These reference images may be used to restore the true sign of the magnetization of the corresponding IR-prepared images, according to the known PSIR technique. Motion correction may be applied to correct the PSIR reference images relative to the IR images prior to application of the PSIR reconstruction algorithm.

A composite image is generated from the reconstructed images at S240. Returning to FIG. 4, reconstructed images 421-425 are averaged to generate composite image 430. Accordingly, the real and imaginary values of each complex pixel of composite image 430 are averages of the real and imaginary values of the same pixel in images 421-425. Since each of images 421-425 includes its own unique CS-related artifacts, composite image 430 contains even fewer artifacts (i.e., the image-specific artifacts are "averaged away") and exhibits a higher SNR than images 421-425.

According to some embodiments, images 421-425 are registered to one another and/or motion-corrected with respect to a reference image prior to generation of composite image 430. The reference image may comprise one of images 421-425, an average image of images 421-425, or another reference image.

Figure 6:
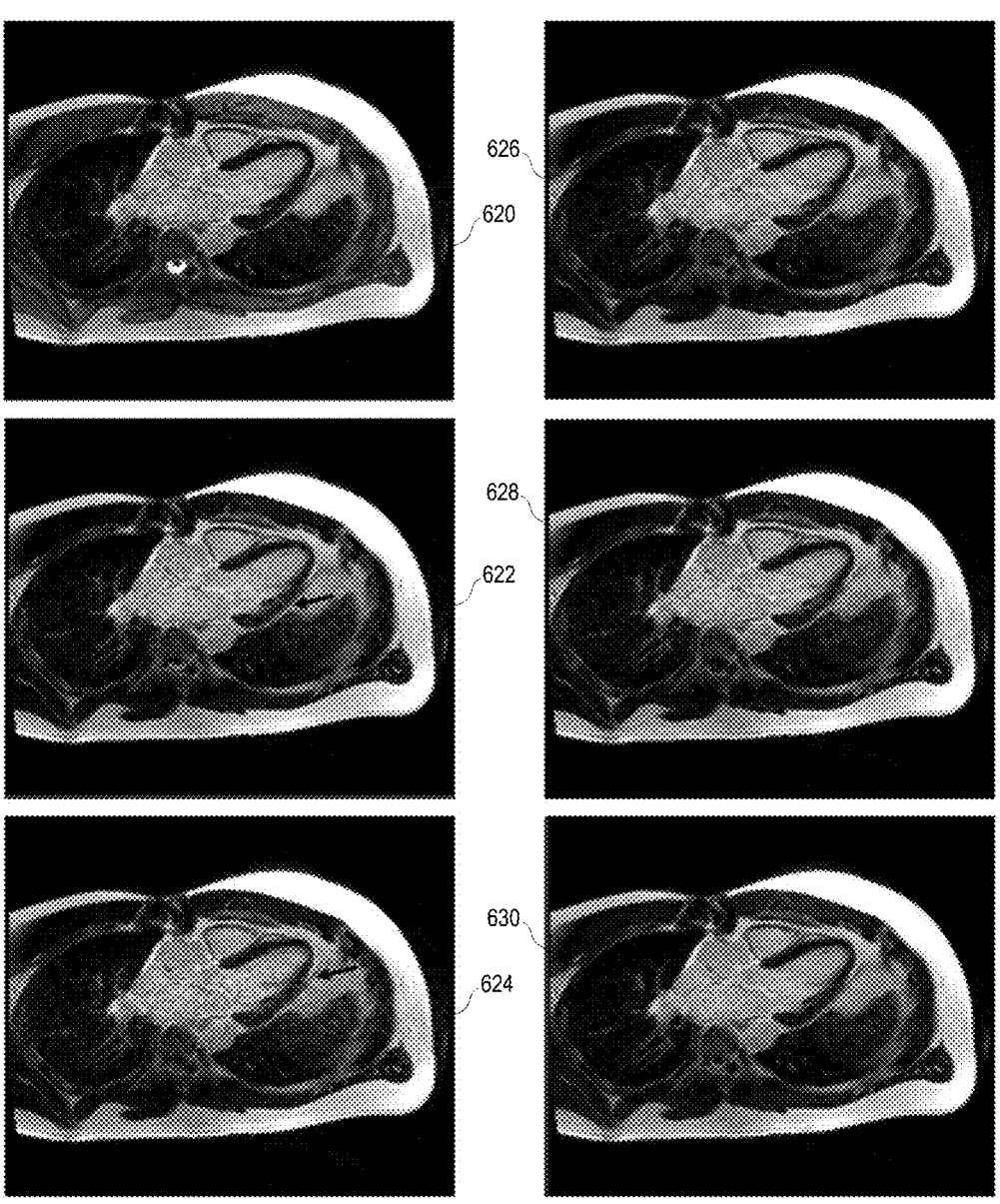
FIG. 6 illustrates images reconstructed from different incoherent distributions of k-space data and a combined image generated therefrom according to some embodiments.

FIG. 6 illustrates images 620, 622, 624, 626 and 628 reconstructed from respective different incoherent distributions of k-space data and combined image 660 generated therefrom according to some embodiments. Images 620, 622, 624, 626 and 628 may comprise jointly reconstructed breath-held single-shot LGE images according to some embodiments. Images 620, 622, 624, 626 and 628 may comprise free breathing images in some embodiments, even though the joint sparsity of a series of free breathing images is typically lower than the joint sparsity of a series of breath-held images.

Each of images 620, 622, 624, 626 and 628 exhibits slightly different artifacts due to their different underlying k-space data distributions. Image 660 may comprise an average of images 620, 622, 624, 626 and 628. Consequently, the artifacts exhibited in images 620, 622, 624, 626 and 628 are largely absent from image 660. Moreover, averaging 620, 622, 624, 626 and 628 results in image 660 exhibiting a higher SNR than images 620, 622, 624, 626 and 628.

Figure 7:
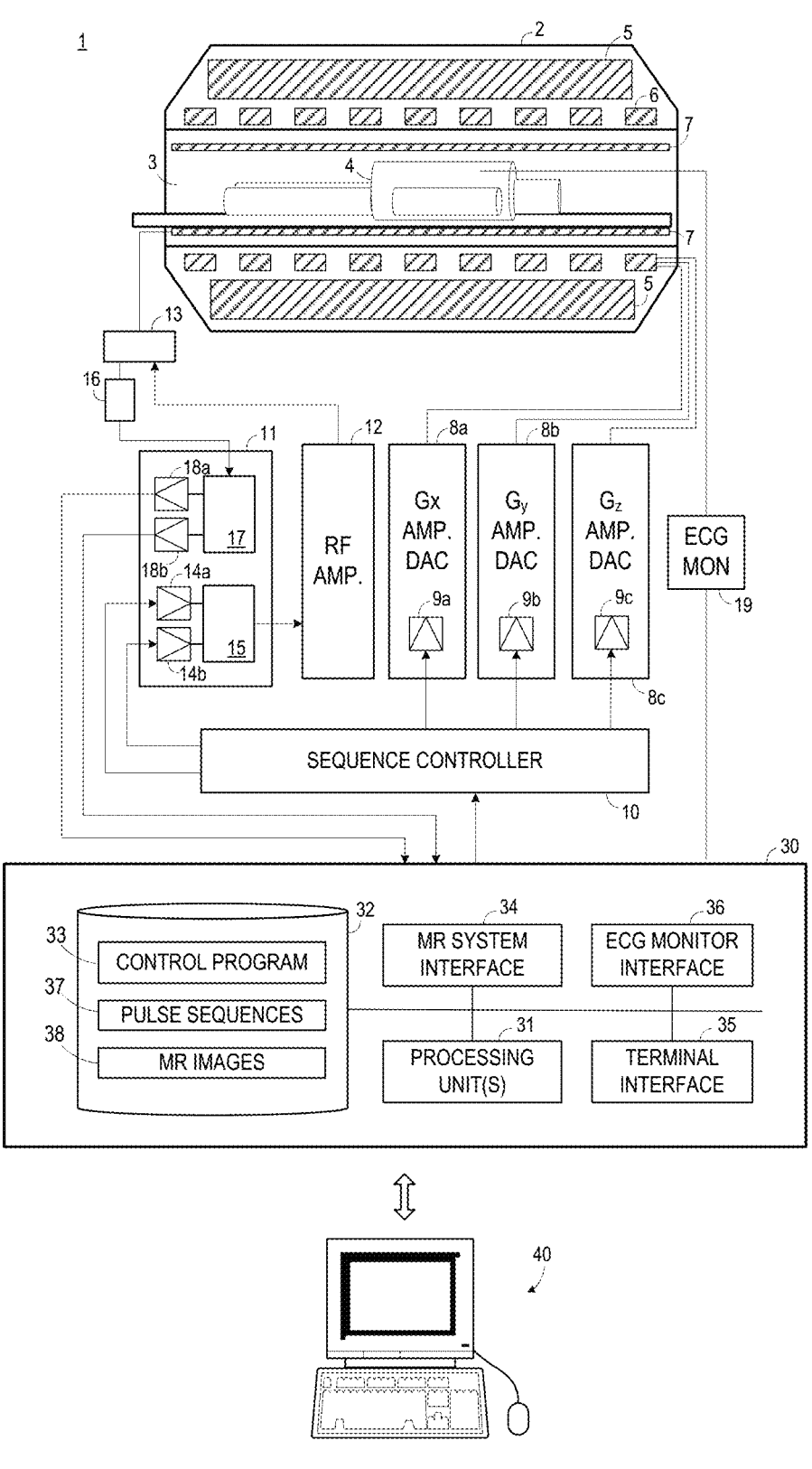
FIG. 7 is a block diagram of an example MR system for use in some embodiments.

FIG. 7 illustrates MR system 1 according to some embodiments. MR system 1 includes MR chassis 2, which defines bore 3 in which patient 4 is disposed. MR chassis 2 includes polarizing main magnet 5, gradient coils 6 and RF coil 7 arranged about bore 3. According to some embodiments, polarizing main magnet 5 generates a uniform main magnetic field ($B_0$) and RF coil 7 emits an excitation field ($B_1$).

According to MR techniques, a substance (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly-oriented magnetic components in the perpendicular plane (the x-y plane) cancel out one another.

The substance is then subjected to an excitation field (i.e., $B_1$) created by emission of a radiofrequency (RF) pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated, and signals are emitted by the excited spins as they return to their pre-excitation field state. The emitted signals are detected, digitized and processed to reconstruct an image or a spectrum using one of many well-known MR techniques.

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at prescribed times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF power amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and scans the alternating field which is produced as a result of precessing nuclear spins, i.e., the nuclear spin echo signals. The received signals are received by multiplexer 13, amplified by RF amplifier 16 and demodulated in receiving channel 17 of RF system 11 in a phase-sensitive manner. Analog-digital converters 18*a* and 18*b* convert the demodulated signals into digitized real and imaginary components.

Electrocardiograph ("ECG") monitor 19 acquires ECG signals from electrodes placed on patient 4. Such physiological signals may be used by sequence controller 10 to synchronize, or "gate", transmitted RF pulses of a pulse sequence based on the heartbeat of patient 4 as described herein.

Computing system 30 receives the digitized real and imaginary components from analog-digital converters 18*a* and 18*b* and may process the components according to known techniques. Such processing may, for example, include CS-reconstruction of images from different incoherent undersampled k-space data and combining the images as described herein, performing other image reconstruction techniques, applying filters to raw k-space data or to reconstructed images, generating functional magnetic resonance images, calculating motion or flow images, and generating a chemical shift vs. magnitude spectrum.

System 30 may comprise any general-purpose or dedicated computing system. Accordingly, system 30 includes one or more processing units 31 (e.g., processors, processor cores, execution threads, etc.) configured to execute processor-executable program code to cause system 30 to operate as described herein, and storage device 32 for storing the program code. Storage device 32 may comprise one or more fixed disks, solid-state random-access memory, and/or removable media (e.g., a thumb drive) mounted in a corresponding interface (e.g., a USB port).

One or more processing units 31 may execute program code of control program 33 to provide instructions to sequence controller 10 via MR system interface 34. For example, sequence controller 10 may be instructed to initiate a desired pulse sequence of pulse sequences 37. In particular, sequence controller 10 may be instructed to control the switching of magnetic field gradients via amplifiers 8*a*-8*c* at appropriate times, the transmission of radio-frequency pulses having a specified phase and amplitude at specified times via RF system 11 and RF amplifier 12, and the readout of the resulting MR signals. The timing of the various pulses of a pulse sequence may be based on physiological data received by ECG monitor interface 36.

Storage device 32 stores MR images 38 generated as described herein. Such images may be provided to terminal 40 via terminal interface 35 of system 30. Terminal interface 35 may also receive input from terminal 40, which may be used to provide commands to control program 33 in order to acquire k-space sets and generate images as described herein. Terminal 40 may comprise a display device and an input device coupled to system 30. In some embodiments, terminal 40 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 32 may also store data and other program code for providing additional functionality and/or which are necessary for operation of system 30, such as device drivers, operating system files, etc.

Executable program code according to the above description may be stored on a form of non-transitory computer-readable media. Computer-readable media includes volatile and nonvolatile, removable, and non-removable media implemented in any method or technology for storage of information such as program code, data structures, program modules or other data. Computer-readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The foregoing diagrams represent logical architectures for describing processes according to some embodiments, and actual implementations may include more, or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

Embodiments described herein are solely for the purpose of illustration. Those in the art will recognize other embodiments may be practiced with modifications and alterations to that described above.

What is claimed is:

1. A magnetic resonance imaging system comprising:
   a magnet system configured to generate a polarizing magnetic field about at least a portion of a subject;
   a plurality of gradient coils configured to apply at least one gradient field to the polarizing magnetic field;
   a radio frequency (RF) system configured to apply an excitation field to the subject and to acquire magnetic resonance (MR) data from the subject; and
   a processing unit to execute program code to cause the system to:
   acquire a plurality of k-space sets, each of the plurality of k-space sets comprising a different incoherent variable-density under-sampled combination of k-space data points;
   perform iterative reconstruction on the plurality of k-space sets to generate a plurality of images, where each of the plurality of images is associated with a different one of the plurality of k-space sets; and
   generate an image based on the generated plurality of images.

2. The system of claim 1, wherein the iterative reconstruction comprises a compressed sensing reconstruction.

3. The system of claim 2, wherein the iterative reconstruction comprises a joint reconstruction based on a joint sparsity of the plurality of k-space sets.

4. The system of claim 3, wherein the plurality of images comprise complex pixel values, and wherein generation of the image comprises averaging the plurality of images.

5. The system of claim 4, the processing unit to execute program code to cause the system to:

motion-correct each of the plurality of images to a same reference image before generation of the image.

6. The system of claim 1, wherein the plurality of images comprise complex pixel values, and wherein generation of the image comprises averaging the plurality of images.

7. The system of claim 6, the processing unit to execute program code to cause the system to:

motion-correct each of the plurality of images to a same reference image before generation of the image.

8. The system of claim 1, wherein each of the plurality of k-space data segments is acquired using a different inversion time.

9. The system of claim 1, wherein acquisition of the plurality of k-space sets comprises acquisition of each of the plurality of k-space sets at a predetermined time after an inversion pulse, wherein the iterative reconstruction comprises a joint reconstruction based on a joint sparsity of the plurality of k-space sets, and wherein generation of the image comprises averaging the plurality of images;

the processing unit to execute program code to cause the system to:

acquire a second plurality of k-space sets interleaved with acquisition of the plurality of k-space sets without a leading inversion pulse;

perform a second joint reconstruction based on a second joint sparsity of the second plurality of k-space sets to generate a second plurality of images, where each of the second plurality of images is associated with a different one of the second plurality of k-space sets;

generate a second image by averaging the second plurality of images; and perform a phase-sensitive reconstruction based on the image and the second image to generate a phase-sensitive inversion recovery image.

10. A method comprising:

acquiring a plurality of k-space sets, each of the plurality of k-space sets comprising a different incoherent vari-able-density under-sampled combination of k-space data points;

performing iterative reconstruction on the plurality of k-space sets to generate a plurality of images, where each of the plurality of images is associated with a different one of the plurality of k-space sets; and combining the generated plurality of images to generate an image.

11. The method of claim 10, wherein the iterative recon-struction comprises a joint compressed sensing reconstruc-tion based on a joint sparsity in image space of the plurality of k-space sets.

12. The method of claim 10, wherein the plurality of images comprise complex pixel values, and wherein com-bining the generated plurality of images comprises averag-ing the plurality of images.

13. The method of claim 12, further comprising:

motion-correcting each of the plurality of images to a same reference image before generation of the image.

14. The method of claim 10, wherein each of the plurality of k-space sets is acquired using a different inversion time.

15. The method of claim 10, wherein acquiring the plurality of k-space sets comprises acquiring each of the plurality of k-space sets at a predetermined time after an inversion pulse, wherein the iterative reconstruction comprises a joint reconstruction based on a joint sparsity of the plurality of k-space sets, and wherein combining the generated plurality of images comprises averaging the plurality of images;

the method further comprising:

acquiring a second plurality of k-space sets interleaved with acquisition of the plurality of k-space sets without a leading inversion pulse;

performing a second joint reconstruction based on a second joint sparsity of the second plurality of k-space sets to generate a second plurality of images, where each of the second plurality of images is associated with a different one of the second plurality of k-space sets;

generating a second image by averaging the second plurality of images; and performing a phase-sensitive reconstruction based on the image and the second image to generate a phase-sensitive inversion recovery image.

16. One or more non-transitory computer-readable media storing program code executable by one or more processing units to cause a computing system to:

acquire a plurality of k-space sets, each of the plurality of k-space sets comprising a different incoherent variable-density under-sampled combination of k-space data points;

perform iterative reconstruction on the plurality of k-space sets to generate a plurality of images, where each of the plurality of images is associated with a different one of the plurality of k-space sets; and averaging the generated plurality of images to generate an image.

17. The one or more non-transitory computer-readable media of claim 16, wherein the iterative reconstruction comprises a joint reconstruction based on a joint sparsity of the plurality of k-space sets.

18. The one or more non-transitory computer-readable media of claim 16, wherein acquisition of the plurality of k-space sets comprises acquisition of each of the plurality of k-space sets at a predetermined time after an inversion pulse, and wherein the iterative reconstruction comprises a joint reconstruction based on a joint sparsity of the plurality of k-space sets;

the program code executable by one or more processing units to cause a computing system to:

acquire a second plurality of k-space sets interleaved with acquisition of the plurality of k-space sets without a leading inversion pulse;

perform a second joint reconstruction based on a second joint sparsity of the second plurality of k-space sets to generate a second plurality of images, where each of the second plurality of images is associated with a different one of the second plurality of k-space sets;

average the second plurality of images to generate a second image; and perform a phase-sensitive reconstruction based on the image and the second image to generate a phase-sensitive inversion recovery image.

19. The one or more non-transitory computer-readable media of claim 16, the program code executable by one or more processing units to cause a computing system to:

motion-correct each of the plurality of images to a same reference image before generation of the image.

20. The one or more non-transitory computer-readable media of claim 16, wherein each of the plurality of k-space sets is acquired using a different inversion time.

* * * * *